United States Patent [19]
Woodhead

[11] 4,340,865
[45] Jul. 20, 1982

[54] ELECTRIC AMPLIFIER CIRCUITS THAT RESPOND TO AN INPUT SIGNAL OF EITHER POLARITY TO PRODUCE AN OUTPUT SIGNAL HAVING A POLARITY CORRESPONDING TO THAT OF THE INPUT SIGNAL

[75] Inventor: Peter Woodhead, Stafford, England
[73] Assignee: The General Electric Company Limited, London, England
[21] Appl. No.: 118,577
[22] Filed: Feb. 4, 1980
[30] Foreign Application Priority Data
Feb. 13, 1979 [GB] United Kingdom ............... 7905104
[51] Int. Cl.³ ........................... H03F 3/45; H03F 1/34
[52] U.S. Cl. ...................................... 330/69; 330/85; 330/105; 330/108
[58] Field of Search .............. 330/69, 105, 108, 260, 330/85

[56] References Cited
U.S. PATENT DOCUMENTS
3,747,008 7/1973 Zaretsky ........................... 330/69 X Primary Examiner—James B. Mullins
Attorney, Agent, or Firm—Kirschstein, Kirschstein, Ottinger & Cobrin

[57] ABSTRACT

An electric amplifier adapted to respond to an input signal of either polarity comprising a first differential amplifier OP1 which is arranged to drive through a load L a current whose value varies with the input but is independent of the load value and a second differential amplifier OP2 arranged to maintain the ratio of the amplifier output potentials relative to a datum potential at a predetermined value so that by appropriate choice of the datum potential and the predetermined ratio value the available output potential swing with a given supply voltage can be maximized.

6 Claims, 1 Drawing Figure

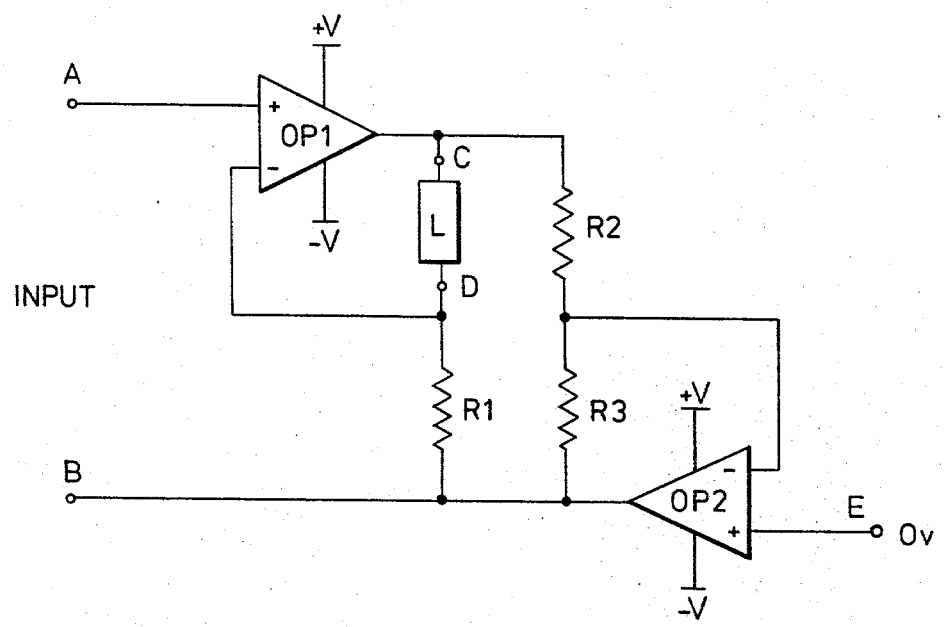

4,340,865

ELECTRIC AMPLIFIER CIRCUITS THAT RESPOND TO AN INPUT SIGNAL OF EITHER POLARITY TO PRODUCE AN OUTPUT SIGNAL HAVING A POLARITY CORRESPONDING TO THAT OF THE INPUT SIGNAL

This invention relates to electric amplifier circuits.

The invention relates particularly to electric amplifier circuits of the kind adapted to respond to an input signal of either polarity to produce an output signal of polarity corresponding to the input signal.

With known forms of such amplifier circuits power supplies of appreciably higher voltage than the required output are often required. It is an object of the present invention to provide such an electric amplifier circuit whereby this difficulty is alleviated.

According to the present invention there is provided an electric amplifier circuit comprising: a first differential amplifier; a pair of terminals to which an input is applied in operation; a connection between one input terminal and one of the inputs of the first amplifier; first and second resistances connected in series, in the order stated, between the output of the first amplifier and the other input terminal; a connection between the junction of said first and second resistances and the other input of the first amplifier; a second differential amplifier; a further terminal connected to one input of the second amplifier, to which further terminal a datum potential is applied in operation; a connection between the output of the second amplifier and the end of said second resistance nearer said other input terminal; third and fourth resistances connected in series in the order stated between the output of the first amplifier and the output of the second amplifier; and a connection between the junction of said third and fourth resistances and the other input of said second amplifier.

In an amplifier circuit according to the invention the magnitude and direction of the current in the first resistance is determined by the magnitude and polarity of the input signal. Thus, to supply a current output to a load from the circuit said first resistance may be constituted at least partly by the load.

Similarly the magnitude and polarity of voltage across the first and second resistances is determined by the magnitude and polarity of the input voltage and a voltage output may be supplied to a load from the circuit by connecting the load across at least part of the series combination of said first and second resistances.

As is further explained below, in operation of a circuit in accordance with the invention the ratio of the potentials at the outputs of the first and second amplifiers relative to the datum potential is equal to the ratio of the values of the third and fourth resistances. Thus, by suitably choosing the values of the third and fourth resistances and the datum potential, the potential swings tending to occur at the amplifier outputs can be adapted to the voltages of the supplies available for the amplifiers. In one such arrangement, the ratio of the values of said third and fourth resistances is substantially equal to the ratio of the supply voltages for said first and second amplifiers respectively and each said amplifier is supplied from between lines maintained at substantially equal and opposite potentials with respect to said datum potential. In one particular such arrangement the amplifier supply voltages are substantially equal and the third and fourth resistances are of substantially equal value. The amplifier supply voltages are normally such that the required datum potential is ground potential.

One electric amplifier circuit in accordance with the invention will now be described by way of example with reference to the accompanying drawing which is a diagram of the circuit.

Referring to the drawing, the circuit includes an operational amplifier OP1 having its non-inverting input connected to a terminal A, its output connected to a terminal C, and its inverting input connected to a terminal D, and via a resistor R1 to a terminal B. In operation an input signal voltage, which may be of either polarity is applied between the terminals A and B, and a load resistance L to be supplied with a current having a magnitude and direction dependent on the input signal is connected between the terminals C and D.

The circuit further includes a second operational amplifier OP2 having its non-inverting input connected to a terminal E which is grounded, and its output connected to the terminal B. Across the series connection of the load L and the resistor R1, i.e. between the amplifier outputs, there are connected in series two further resistors R2 and R3 of equal value, and the junction between the resistors R2 and R3 is connected to the inverting input of the amplifier OP2.

The two amplifiers OP1 and OP2 are both energised from between lines maintained at nominally equal and opposite potentials $+V$ and $-V$ with respect to ground.

In operation, when an input voltage is applied between terminals A and B a potential of corresponding polarity is established between the output of amplifier OP1 and terminal B causing a current to pass through the load L and resistor R1. The voltage consequently developed across resistor R1 is fed back to the inverting input of the amplifier OP1, ensuring that the current is maintained constant for a constant input voltage.

Thus the amplifier OP1 together with the load L and resistor R1 operate in conventional manner to maintain a constant current through the load L for a given input voltage regardless of the resistance of the load, the value of the current being determined by the value of resistor R1.

When the resistance of the load L varies, the voltage developed across the load L varies but the amplifier OP2 maintains the junction between the resistors R2 and R3 at ground potential. Since the resistors R2 and R3 are of equal value the potentials at terminal C and terminal B are always equal and opposite relative to ground, as are the supply lines from which the amplifiers OP1 and OP2 are energised. The possible potential swings at the outputs of the amplifiers OP1 and OP2 for a given value of V are thus maximised. Consequently the load resistance may have a relatively high resistance for a given output current.

Since the current drawn by the non-inverting input of the amplifier OP2 is negligible, the potential applied to terminal E is conveniently produced from the supply for the amplifiers by means of a resistive potential divider.

It will be appreciated that the simple relatively low voltage supply arrangement required by the circuit is in itself a significant advantage. Furthermore, since the value of V for a given circuit performance may be lower than in known circuits, the circuit has the advantage over known circuits of lower power consumption and lower power dissipation so that component temperatures can more easily be kept within safe limits.

It will be appreciated that the amplifier OP1 is preferably provided with means for nulling offset voltage, but this is not necessary in the case of amplifier OP2 since the effect of offset voltages thereon is negligible.

It will be understood that the action of the circuit is to swing the input signal relative to ground according to the value of the load L and that the input signal must therefore be isolated.

If the input voltage is too high for direct application to amplifier OP1, a potential divider (not shown) may be used to drop the voltage applied between terminals A and B to a suitable level.

To convert the circuit for use with a current input, a resistor (not shown) may be connected between terminals A and B.

If a voltage output instead of a current output is required from the circuit, this may be obtained from between terminals C and B with a fixed value resistor (not shown) connected between terminals C and D of appropriately chosen value relative to resistor R1.

One particular application of the circuit described by way of example is in an arrangement for measuring a bidirectional quantity, such as power.

It will be appreciated that in general terms the circuit operates to maintain the ratio of the potentials at terminals C and B relative to the potential at terminal E equal to the ratio of the values of the resistors R2 and R3.

In the circuit described by way of example the potential at terminal E and the values of resistances R2 and R3 are chosen to allow a maximum potential swing at the amplifier outputs with both amplifiers supplied from a common supply of $+V$. It will be appreciated that in other circuits in accordance with the invention the ratio of the values of resistors R2 and R3 and/or the potential at terminal E may be chosen differently. For example, with a circuit configuration as shown in the drawing, if the available supply voltages for amplifiers OP1 and OP2 are $\pm 2V$ and $\pm V$ respectively the values of resistors R2 and R3 are suitably chosen to have a ratio of 2:1; and if the available supply voltage for each amplifier is $+V$ the potential applied to terminal E is suitably $+V/2$.

I claim:

1. An electric amplifier circuit for producing in response to an input signal, which may be of either polarity, an output signal of magnitude and polarity determined by the input signal, the circuit comprising: a first differential amplifier; a pair of terminals to which the input signal is applied in operation; a connection between one input terminal and one of the inputs of the first amplifier; first and second resistances connected in series, in the order stated, between the output of the first amplifier and the other input terminal; a connection between the junction of said first and second resistances and the other input of the first amplifier; a second differential amplifier; a further terminal connected to one input of the second amplifier, to which further terminal a datum potential is applied in operation; a connection between the output of the second amplifier and the end of said second resistance nearer said other input terminal; third and fourth resistances connected in series in the order stated between the output of the first amplifier and the output of the second amplifier; and a connection between the junction of said third and fourth resistances and the other input of said second amplifier; the current in said first resistance constituting said output signal, the ratio of the values of said third and fourth resistances being substantially equal to the ratio of the supply voltages for said first and second amplifiers respectively, each said amplifier being supplied from between lines maintained at substantially equal and opposite potentials with respect to said datum potential, and the input signal being isolated from said supply voltages for the amplifiers.

2. A circuit according to claim 1 wherein said third and fourth resistances are substantially equal and the supply voltages for said amplifiers are substantially equal.

3. A circuit according to claim 1 wherein said datum potential is ground potential.

4. A circuit according to claim 1 wherein said first resistance is constituted at least partly by a load of the amplifier circuit.

5. A circuit according to claim 1 wherein a load for the amplifier circuit is connected across at least part of the series combination of said first and second resistances.

6. A circuit according to claim 1 wherein said differential amplifiers are operational amplifiers.

* * * * *